US006961438B1

(12) United States Patent
Fujita

(10) Patent No.: US 6,961,438 B1
(45) Date of Patent: Nov. 1, 2005

(54) LOUDSPEAKER SYSTEM HAVING WIDE-DIRECTIONAL CHARACTERISTICS

(75) Inventor: Takeshi Fujita, Kanagawa-ken (JP)

(73) Assignee: Globo Technology, Inc., Tokyo (JP)

( * ) Notice: Subject to any disclaimer, the term of this patent is extended or adjusted under 35 U.S.C. 154(b) by 0 days.

(21) Appl. No.: 09/468,206

(22) Filed: Dec. 20, 1999

(51) Int. Cl.[7] ......................... H04R 25/00; H04R 9/06; H04R 29/00; H05K 5/00

(52) U.S. Cl. ...................... 381/182; 381/335; 381/336; 381/59; 181/144

(58) Field of Search .......................... 381/59, 332, 335, 381/336, 342, 103, 182; 181/144

(56) References Cited

U.S. PATENT DOCUMENTS 4,146,756 A * 3/1979 Kito et al. .................. 381/426
4,503,553 A * 3/1985 Davis ......................... 381/303
4,673,057 A * 6/1987 Glassco ...................... 181/144
4,890,689 A * 1/1990 Smith ......................... 181/144
5,025,473 A * 6/1991 Carlsen et al. .............. 381/387
5,384,856 A * 1/1995 Kyouno et al. ............. 381/103
5,793,876 A * 8/1998 Derogis et al. ............... 381/89
5,812,685 A * 9/1998 Fujita et al. ................ 381/332
5,889,876 A * 3/1999 Billings ...................... 381/342

FOREIGN PATENT DOCUMENTS

JP 59-31105 9/1984

* cited by examiner

*Primary Examiner*—Huyen Le
*Assistant Examiner*—Andrew Graham
(74) *Attorney, Agent, or Firm*—Staas & Halsey LLP

(57) ABSTRACT

A loudspeaker system having wide-directional characteristics includes a loudspeaker body having a polyhedron shape, preferably of dodecahedron and a plurality of speakers disposed on outer surfaces, respectively, of the polyhedron-shaped loudspeaker body in a manner that axial lines of adjacent two speakers intersect each other at a predetermined angle. A correction filter is further operatively connected to the speakers, and the correction filter provides a correction value set so as to obtain a flatness of sound pressures at various portions around the loudspeaker body.

11 Claims, 7 Drawing Sheets

LOADSPEAKER SYSTEM HAVING WIDE-DIRECTIONAL CHARACTERISTICS

BACKGROUND OF THE INVENTION

1. Field of the Invention

The present invention relates to a loudspeaker system having wide-directional characteristics utilized for speakers of, for example, HiFi-audio systems, acoustic measuring equipments and the like, particularly, in which a plurality of speakers are arranged at peripheral surface portions of a polyhedron or spherical body thereby allowing good quality sound reception by a listener from various directions.

2. Relevant Art of the Invention

One example of a loudspeaker of the type mentioned above is disclosed in Japanese Utility Model Laid-open (KOKAI) Publication No. SHO 59-31105.

This discloses a loudspeaker having a body of a regular dodecahedron shape, as a polyhedron shape, having respective surfaces to which uni-molf oscillators and diaphragms (oscillating plates) are arranged, respectively, thereby to listen sounds from the various directions around the polyhedron body.

However, it is generally known, in a speaker of the conventional structure, that a high-frequency attenuation is caused except along a transverse (frontal) surface of an axial line of the speaker, and in the described prior art, in which the uni-molf oscillators and diaphragms are arranged on the respective surfaces of the polyhedron body, the respective uni-molf oscillators are necessarily not arranged on the same one plane and arranged at positions inclined with each other. Accordingly, because of the fact that the high frequency attenuation is caused except along the frontal surface on the axial line of each of the uni-molf oscillators, it is difficult to listen to the sounds, in good quality, in the range of low to high frequencies at all the positions at the entire peripheral surface of the speaker system.

In the HiFi audio speaker, the flatness of the frequency for maintaining constant the sound pressure even if the frequency varies was required. Further, it was also required for the speaker for specially measuring acoustic sounds to be provided with the flatness of the frequency and non-directional property thereof, but no countermeasure was substantially taken, in the conventional art, against the high frequency attenuation due to the inclined arrangement of the respective speakers.

SUMMARY OF THE INVENTION

An object of the present invention is to substantially eliminate defects or drawbacks encountered in the prior art mentioned above and to provide a loudspeaker system having wide-directional characteristics capable of obtaining substantially uniform sound pressure in the range of low to high frequencies.

This and other objects can be achieved according to the present invention by providing a loudspeaker system having a wide-directional characteristic comprising:

a loudspeaker body having a polyhedron shape;

a plurality of speakers disposed on an outer peripheral surface of the loudspeaker body in a manner that axial lines of adjacent two speakers intersect each other at a predetermined angle; and a correction filter operatively connected to the speakers, the correction filter providing correction value set so as to obtain a flatness of sound pressures at various portions around the loudspeaker body.

In a preferred embodiment, the loudspeaker body has a regular polyhedron shape having a plurality of outer surfaces on which the speakers are arranged respectively.

The regular polyhedron shape is a regular dodecahedron shape having twelve outer surfaces on which twelve speakers are arranged, respectively, the twelve speakers including three sets of speaker groups connected in parallel to each other, one of three sets of speaker groups including four speakers connected in series. In a modified embodiment, the twelve speakers may includes four sets of speaker groups connected in series, one of four sets of speaker groups including three speakers connected in parallel to each other.

The correction filter includes at least two resistors and capacitors which are operatively connected.

In a further preferred embodiment, the loud-speaker body having a spherical shape may be utilized.

According to the structures and characters of the present invention, mentioned above, by arranging the correction filter, the flatness of the sound pressure level can be maintained in the inclination characteristic (i.e., in the relation between the sound pressure and the sound frequency) even if the frequency varies, so that the sound around the entire periphery of the wide-directional loudspeaker system can approach the actual sound. Therefore, this wide-directional loudspeaker system is utilized as a loudspeaker for a HiFi audio system, a sound measuring system or the like, and there can be provided an excellent sound reproducing effect for market users of industrial speakers or the like and also provide an accurate sound (acoustic) stage therefor.

Furthermore, the wide-directional loudspeaker system of the present invention can provide a correct omnidirectional echo field in space as well as in spectrum in a room and can realize a good listening feeling with minimum generation of an incidental sound of the room itself without causing acoustic degradation based on a degradation of back characteristic in a conventional directional frontal projection type speaker, thus providing practical advantageous effects.

In a preferred embodiment, since the loudspeaker body has a regular polyhedron shape such as dodecahedron shape, the flatness of the sound pressures at various positions around the loudspeaker body can be maintained by setting the correction value of the correction filter to one predetermined value.

Furthermore, in the embodiment in which the twelve speakers arranged on the twelve surfaces of the dodecahedron-shaped loudspeaker body may includes four sets of speaker groups connected in series, one of four sets of speaker groups including three speakers connected in parallel to each other, the sound quality can be further improved.

The nature and further characteristic features of the present invention will be made more clear from the following descriptions made with reference to the accompanying drawings.

DESCRIPTION OF THE PREFERRED EMBODIMENTS

First Embodiment

FIGS. 1 to 8 represents the first embodiment of the present invention.

Figure 2:
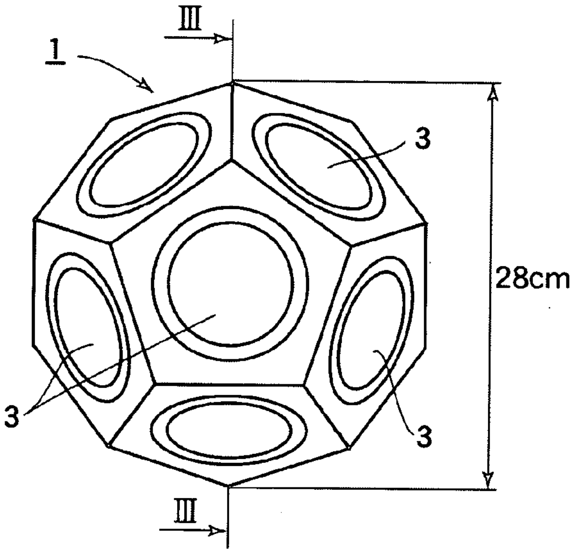
FIG. 2 is a front view of the loudspeaker system of FIG. 1.
Figure 3:
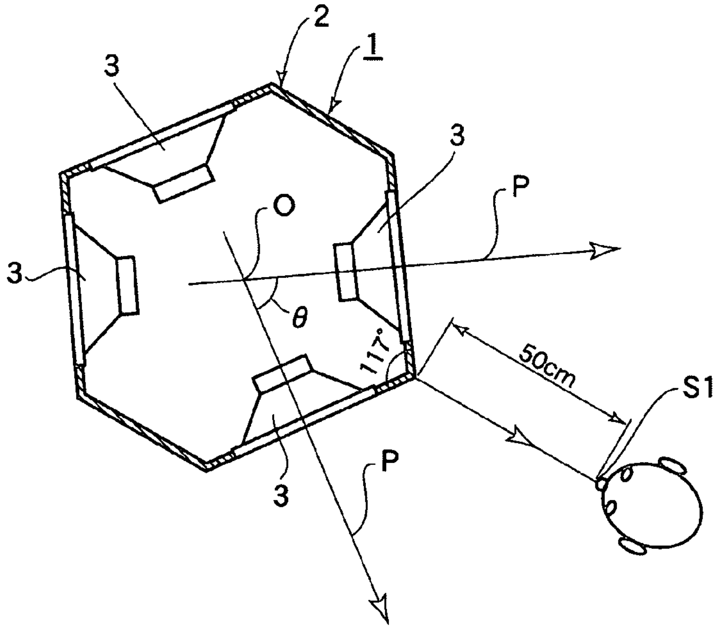
FIG. 3 is a sectional view taken along the line III—III in FIG. 2.

With reference to these figures, reference numeral 1 in FIG. 2 denotes a loudspeaker system having wide-directional characteristics (which may be called "wide-directional loudspeaker system" or merely "loudspeaker system" hereinlater). The wide-directional loudspeaker comprises a loudspeaker body 2 having a regular dodecahedron shape as a polyhedron body having a plurality (twelve) of surface portions on which a plurality (twelve) of coil speakers are arranged respectively. These speakers 3 have axial lines P passing the center of the loudspeaker body 2 as shown in FIG. 3, and in this embodiment, adjacent two axial lines P intersect each other at an angle θ, which is set in this embodiment to 63°.

Figure 1:
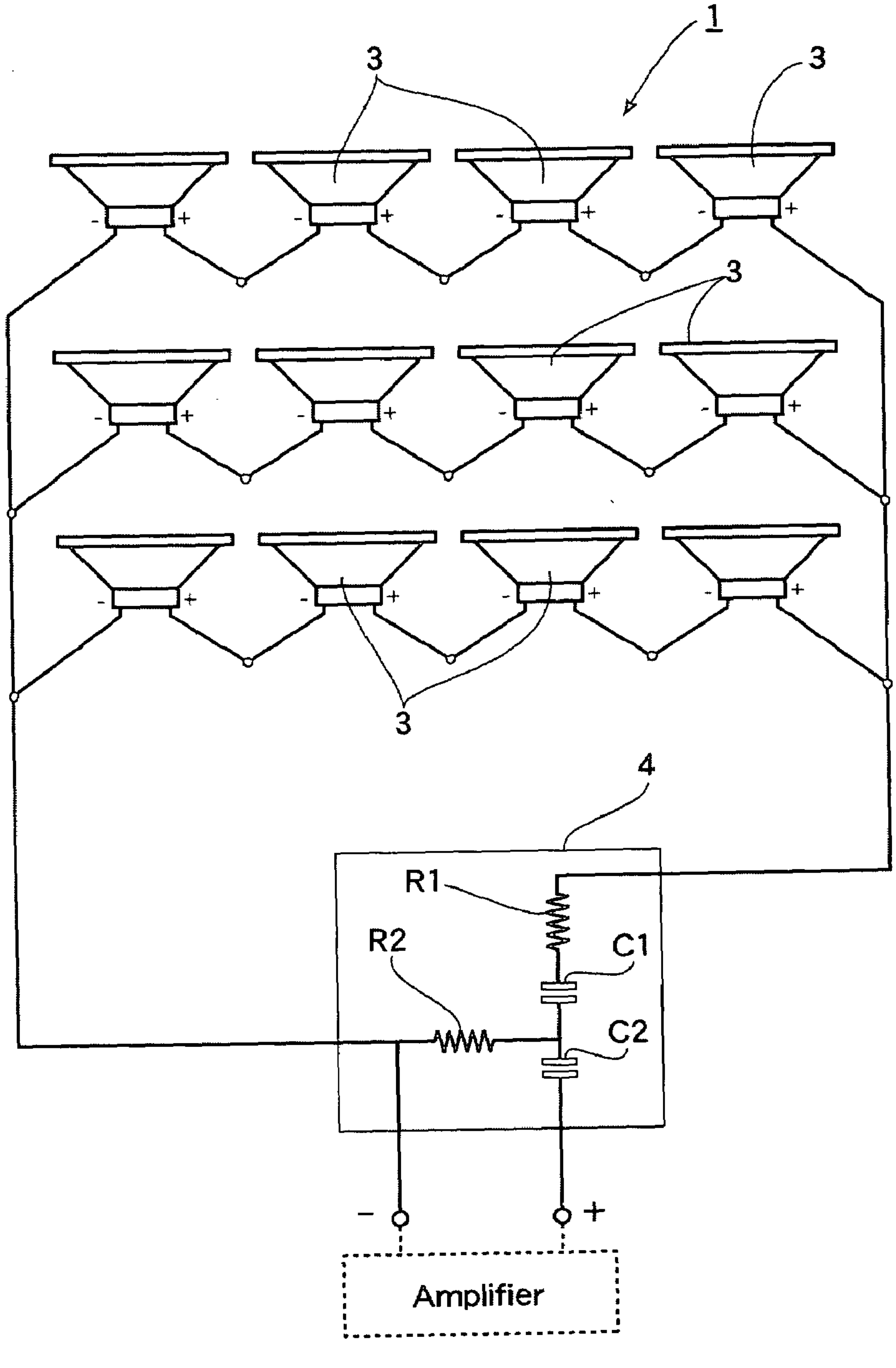
FIG. 1 is a circuit diagram showing a loudspeaker system having a wide-directional characteristics according to a first embodiment of the present invention.

These twelve speakers 3 are arranged as a circuit diagram such as shown in FIG. 1 in three sets of speaker groups (rows) which are connected in parallel to each other, each set including four speakers 3 connected in series. A correction filter 4 including resistors R1 and R2 and capacitors C1 and C2 is connected between these speakers 3 and an amplifier.

Figure 4:
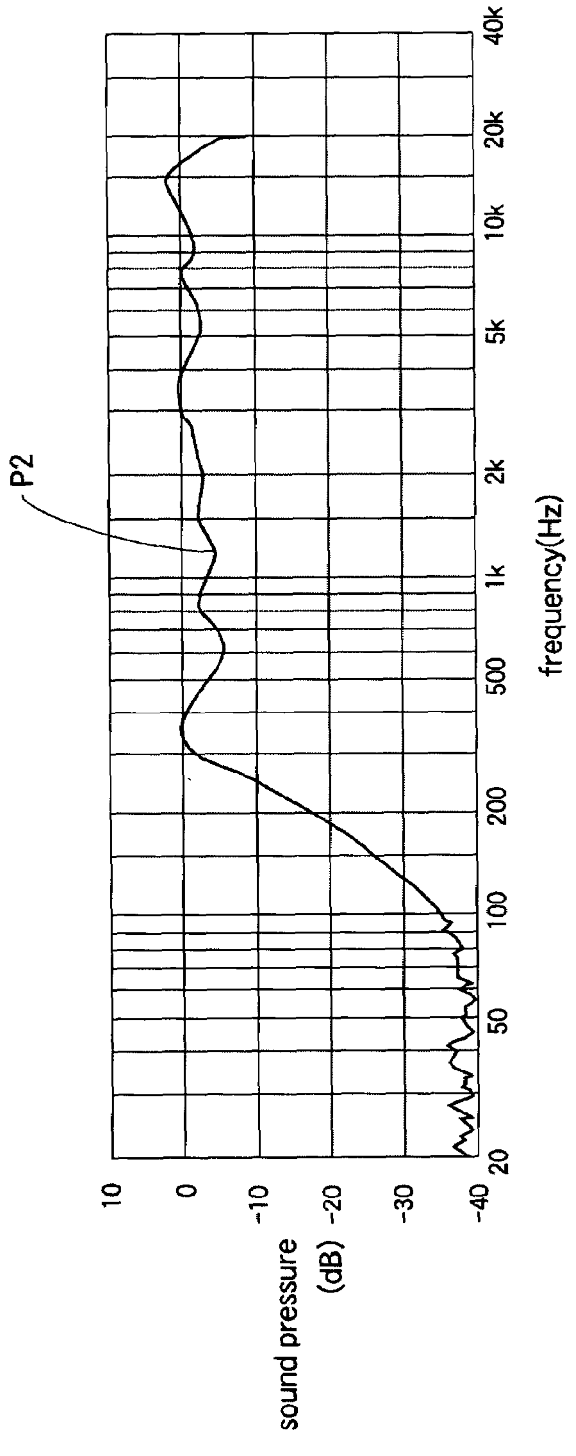
FIG. 4 is a graph showing a relationship between a sound pressure and a frequency in a case where the loud-speaker of FIG. 1 is provided with a correction filter.
Figure 5:
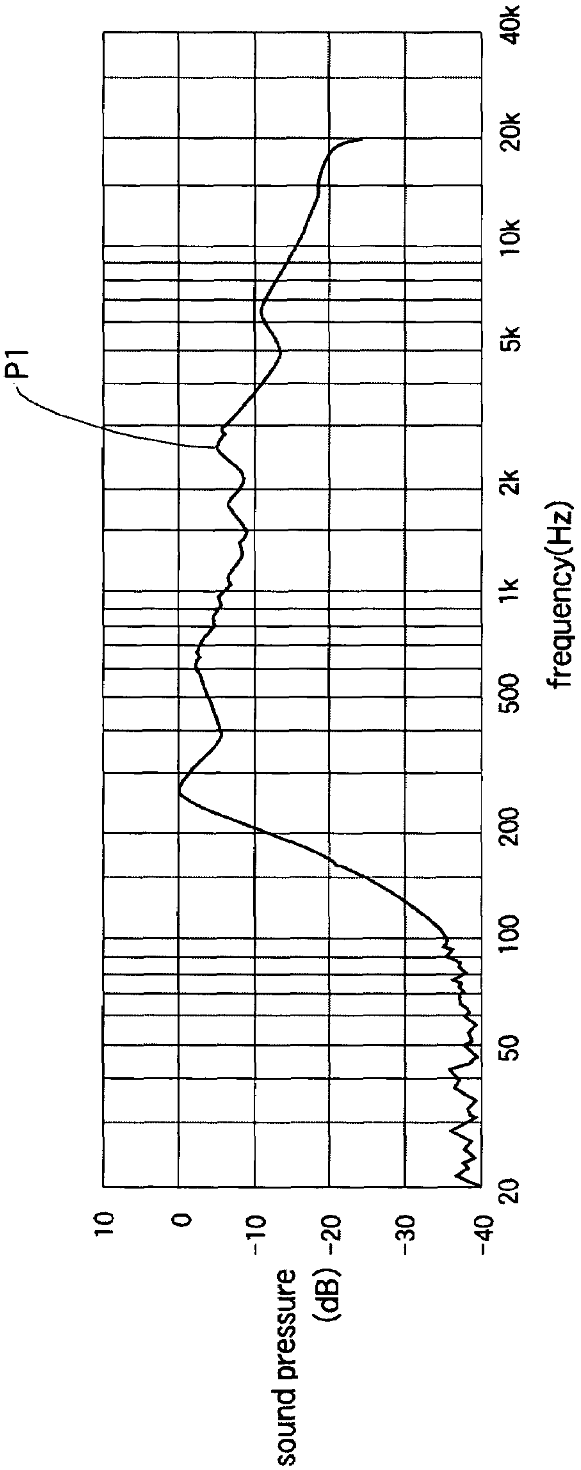
FIG. 5 is a graph corresponding to that of FIG. 4 in a case where the loudspeaker of FIG. 1 is not provided with the correction filter.
Figure 6:
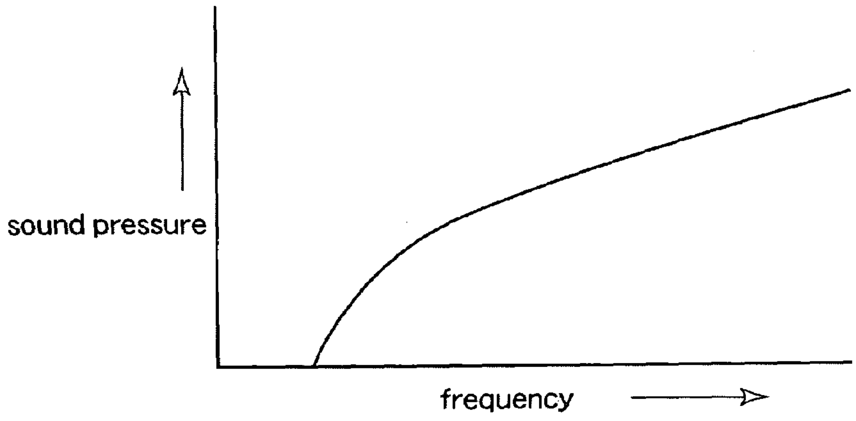
FIG. 6 is a graph showing a relationship between a sound pressure and a frequency of the correction filter.

The correction filter 4 sets values (correction values) of the resistors R1 and R2 and the capacitors C1 and C2 so as to obtain the flatness of the sound pressure at the respective positions on the periphery of the loudspeaker body 2. That is, as shown in FIG. 3, a measuring position S1 separated by about 50 cm from the apex between the adjacent two coil speakers 3 is a position having the maximum inclination characteristic. In the case of no correction filter 4, a characteristic curve P1, as shown in FIG. 5, between the frequency and the sound pressure shows the characteristic such that as the frequency is made higher than about 500 Hz, the sound pressure is attenuated. Accordingly, as shown in FIG. 6, by using the correction filter 4 so as to make high the sound pressure as the frequency is made high, the correction filter is set so that a characteristic curve P2 in the inclination characteristic can maintain the flatness as shown in FIG. 4.

Because an attenuation factor in the arrangement mentioned above, is determined by the angle θ constituted by the axial lines P of the adjacent coil speakers 3 and the characteristic feature of the coil speakers 3, the correction value of the correction filter 4 is properly set in accordance with the attenuation factor. Further, it is to be noted that in cases of polyhedron shapes other than that shown in FIGS. 2 and 3, the angle θ varies and an interference distance (zone) moves, and the correction filter 4 is also properly set in accordance with such variation and movement.

According to the manner mentioned above, even in the arrangement that the coil speakers 3 are arranged in the inclined positions, the flat characteristic curve P2 can be obtained and, hence, the sound in good quality can be obtained at all the positions around the loudspeaker system 1.

Figure 7:
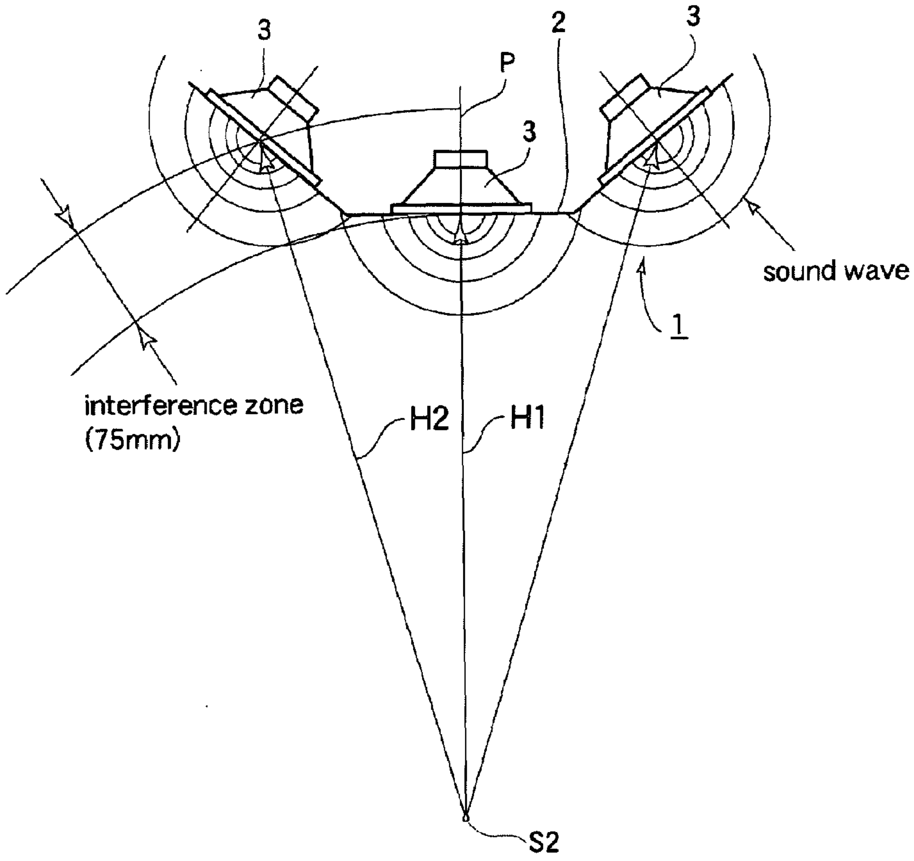
FIG. 7 is a view showing an arrangement that a measuring position of the loud speaker system of the first embodiment of FIG. 1 lies on an axial line of coil speakers.

Furthermore, as shown in FIG. 7, at the measuring position S2 on the axial lines P of the coil speakers 3, the characteristics of the coil speakers 3 are set so as to maintain the flatness of the sound pressure in the state of no correction filter 4, and accordingly, there may cause a fear that the flatness of the sound pressure cannot be maintained at the high frequency level in the case where the correction filter 4 is disposed. However, in such case, the flatness of the sound pressure on the axial line P can be maintained from the following reason.

That is, generally at an ordinary temperature, an equation (Eq. 1) of $\lambda=c/f$ is established (where "λ" is wavelength of sound; "c" is acoustic velocity (about 343.5 m/sec); and "f" is frequency). Therefore, in the described embodiment 1, providing that one wavelength λ=150 mm, the frequency f=about 2.3 kHz would be calculated from the above Eq. 1.

Figure 8:
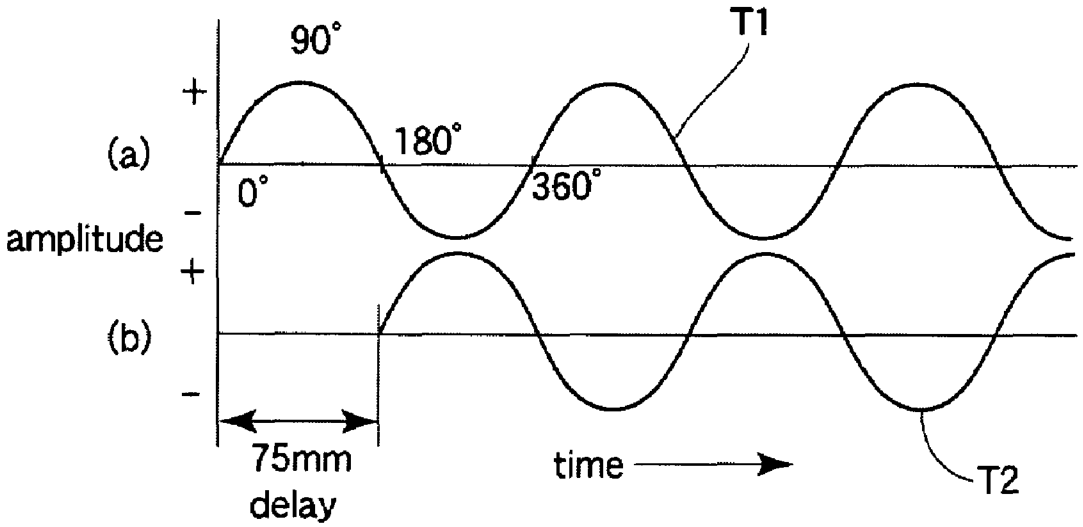
FIG. 8 is a view showing a wave-shape (form) at the measuring position of FIG. 7.

Accordingly, a wave-shape T1 of the sound from the central speaker 3 at the high frequency (here, about 2.3 kHz) at the measuring position S2 on the axial lines P of the coil speakers 3 in FIG. 7 will be shown as (a) in FIG. 8 and a wave-shape T2 of the sound from the speakers 3 on both sides of the central speaker 3 will be shown as (b) in FIG. 8, which has about 75 mm delay. This is because, as shown in FIG. 7, since there is a difference of about 75 mm between a distance H1 from the measuring position S2 to the center of the central speaker 3 on the axial line P and a distance H2 from the measuring position S2 and the center of the speaker 3 on the axial line P disposed adjacent to the central speaker 3, the sounds generated at the same time from these central and adjacent speakers 3 have shifting in wavelengths therebetween of an amount corresponding to about the separated distance, i.e. about 75 mm in the described example, and in such case, since the phase is shifted by 180°, a mutual interference is caused. As a result, a high pass increasing due to the arrangement of the correction filter 4 is suppressed, thus substantially maintaining the flatness in the frontal characteristic. It is however noted that the interference frequencies are different due to the individual frequency characteristics of the respective coil speakers 3.

As mentioned above, by arranging the correction filter 4, the flatness of the sound pressure level can be maintained in the inclination characteristic even if the frequency varies, so that the sound around the entire periphery of the wide-directional loudspeaker system can approach to the actual sound.

Accordingly, by using the wide-directional loudspeaker system 1 of the present invention mentioned above as a loudspeaker for a HiFi audio system, a sound measuring system or the like, there can be provided an excellent sound reproducing effect for market users of industrial speakers or the like and also provided an accurate sound (acoustic) stage therefor.

More in detail, uniform sound reproducing effect can be achieved at every positions in a room sound reproducing field by the wide-directional loudspeaker system 1 of the present invention, and as a result, an increased area of good stereophonic image can be formed, thereby realizing the satisfactory sound reproducing effect, and thus, a listener will be released from the necessity that he must keep his position only at one listening point. This is because of the uniform 360° horizontal and vertical dispersions by the wide-directional loudspeaker system 1 of the present invention, and according to this characteristic feature, substantially perfect effective listenable zone of a listening area with minimum early reflection by a floor or ceiling will be obtained.

Furthermore, the wide-directional loudspeaker system 1 of the present invention can provide a correct omnidirectional echo field in space as well as in spectrum in a room and can realize a good listening feeling with minimum generation of an incidental sound of the room itself without causing acoustic degradation based on a degradation of back characteristic in a conventional directional frontal projection type speaker.

Still furthermore, in the present invention described above, the correction filter 4 having an extremely simple structure composed of the resistors R1 and R2 and the capacitors C1 and C2 is arranged at one portion. The correction filter 4 is arranged inside the loudspeaker body 2, so that it is not necessary to locate any external specific filter or pre-amplifier, which fascilitates the easy handling thereof.

Second Embodiment

Figure 9:
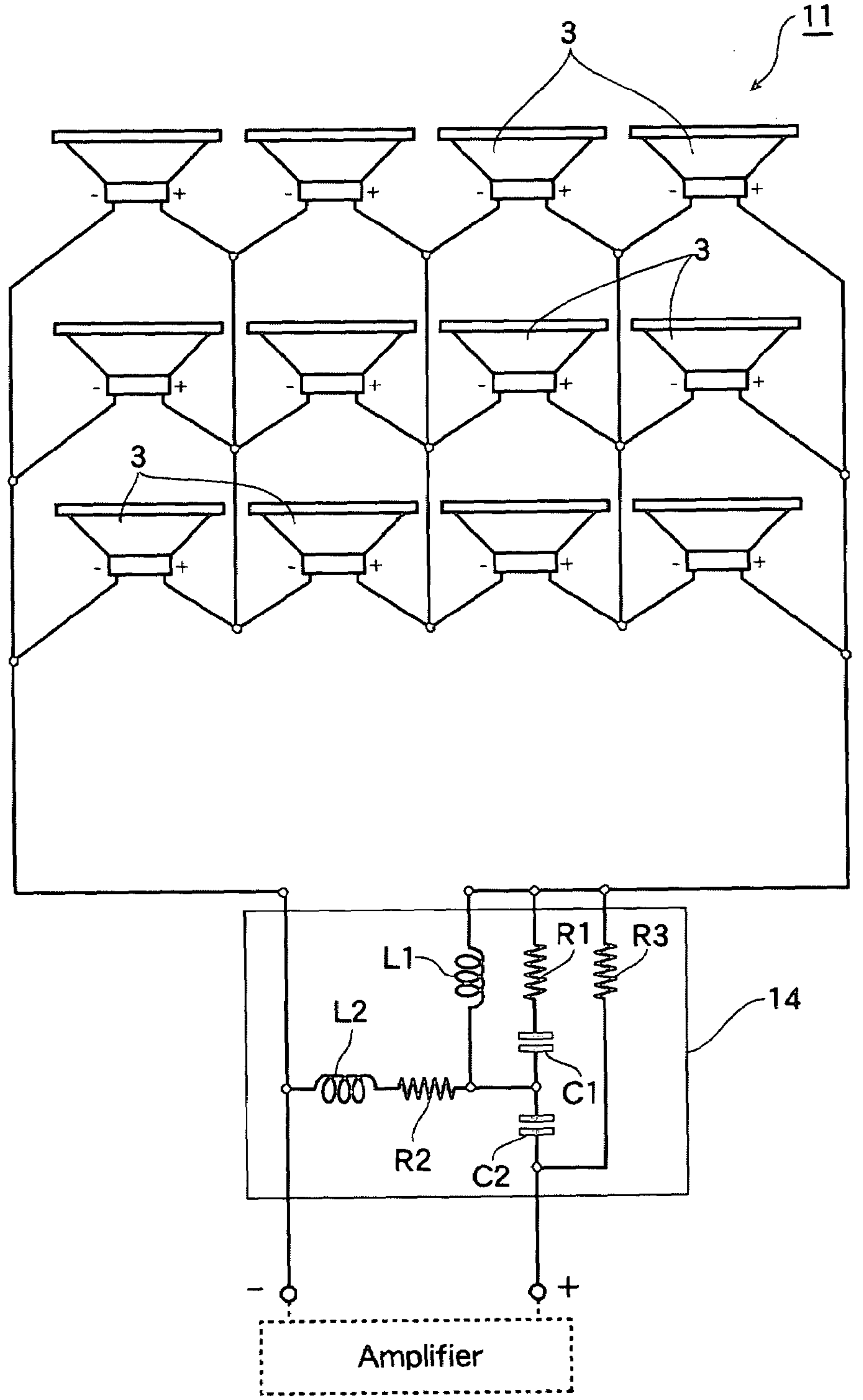
FIG. 9 is a circuit diagram showing a loudspeaker system having a wide-directional characteristics according to a second embodiment of the present invention.

FIG. 9 represents the second embodiment of the present invention.

With reference to FIG. 9, a loudspeaker system 11 having wide-directional characteristics has a regular dodecahedron shape as in the first embodiment, but it has a size larger than that of the first embodiment. Although, in the first embodiment, the separated distance is 75 mm as shown in FIG. 7, in this second embodiment, this distance is 120 mm.

In this second embodiment, three coil speakers 3 are connected in parallel to each other vertically in FIG. 9 as one set and four sets of these coil speakers 3 are then connected in series (lines) though the composite impedance is the same.

In such arrangement of the second embodiment, with reference to FIG. 7, since a separated difference between a distance H1 from the measuring position S2 to the center of the central speaker 3 on the axial line P and a distance H2 from the measuring position S2 and the center of the speaker 3 on the axial line P disposed adjacent to the central speaker 3 is set to about 120 mm, the interference occurs from a low frequency area of about 1.4 kHz in accordance with the equation 1 (Eq. 1) at the measuring position S2. For this reason, a correction filter 14 of this second embodiment further includes coils L1 and L2 and a resistor R3 in addition to the resistors R1 and R2 and capacitors C1 and C2 of the correction filter 4 of the first embodiment. According to this arrangement, the flatness of the sound pressure can be ensured.

Furthermore, in the second embodiment, since three coil speakers 3 are connected in parallel as one set and four sets of these coil speakers 3 are then connected in four lines in series, the sound quality at the sound listening time can be further improved in comparison with the arrangement of the first embodiment, and listeners confirmed this fact.

It is to be noted that the present invention is not limited to the described embodiments and many other changes or modifications may be made without departing from the scopes of the appended claims.

For example, in the above embodiments, although the coil speaker 3 is utilized as a loudspeaker, a capacitor speaker may be instead used, and furthermore, the correction filter used for the present invention is not limited to the filter of the structure or type mentioned above, other correction filters including capacitors, resistors and coils, the numbers or types of which are different from those mentioned in the above embodiments, may be also utilized in accordance with the types or structures of the speakers to which the correction filters are assembled as far as the flatness of the frequency characteristics are maintained.

Still furthermore, in the described embodiments, although the loudspeaker body is formed so as to provide the regular dodecahedron shape, other polyhedron shape having more or less number of surfaces may be utilized, and in a more specific case, a spherical body may be utilized.

Further, it is to be noted that the amount to be corrected by the correction filter will be made small and the flatness of the sound pressure will be further maintained in a case where a polyhedron body having more than twelve surfaces or a spherical body is used because, in such case, an angle constituted by the axial lines of the adjacent two speakers can be made small thereby to make small the inclination characteristic.

What is claimed is:

1. A loudspeaker system having wide-directional characteristics comprising:

a loudspeaker body having a regular dodecahedron shape;

twelve full range speakers, all having same frequency characteristics, disposed on outer peripheral surfaces of the loudspeaker body in a manner that axial lines of any adjacent two speakers intersect each other at a predetermined same angle, the twelve speakers being arranged either in a manner that said twelve speakers including three sets of speaker groups connected in parallel to each other, each speaker group including four speakers connected in series, or in a manner that said twelve speakers including four sets of speaker groups connected in series, each speaker group including three speakers connected in parallel to each other; and one correction filter operatively connected to the speakers and increasing sound pressures in relation to increasing sound frequencies to flatten the sound pressures at a position existing on a line extending straight from a center of the dodecahedron toward an outside of the dodecahedron via an apex position of the adjacent two speakers, wherein at the position an average attenuation in sound pressure versus the increasing sound frequencies from about 500 Hz and greater is maximum without the correction filter.

2. A loudspeaker system according to claim 1, wherein said correction filter includes at least two resistors and two capacitors which are operatively connected.

3. The loudspeaker system of claim 1, wherein the sound pressure is increased according to the position having the maximum sound pressure attenuation characteristic in a relationship between the increasing sound frequency of about 500 Hz and about 20 kHz, without the correction filter.

4. The loudspeaker system of claim 3, wherein characteristics of the speakers are set to maintain the flatness of the sound pressures at a position outside each speaker along an axial line of each speaker without the correction filter.

5. The loud speaker system of claim 1, wherein each speaker is a single cone full range unit speaker.

6. A loudspeaker system according to claim 1, wherein the correction filter is an analog circuitry.

7. A loudspeaker system according to claim 1, wherein the correction filter is disposed between an amplifier and the 12 speakers.

8. A loudspeaker system having wide-directional characteristics comprising:

a loudspeaker body having a spherical shape;

twelve full range speakers, all having same frequency characteristics, disposed on outer peripheral surfaces of the loudspeaker body in a manner that axial lines of any adjacent two speakers intersect each other at a predetermined same angle, the twelve speakers being arranged either in a manner that said twelve speakers including three sets of speaker groups connected in parallel to each other, each speaker group including four speakers connected in series, or in a manner that said twelve speakers including four sets of speaker groups connect in series, each speaker group including three speakers connected in parallel to each other; and one correction filter operatively connected to the speakers and increasing sound pressures in relation to increasing sound frequencies to flatten the sound pressures at a position existing on a line extending straight from a center of the spherical shape toward an outside of the spherical shape via a center position between the axial lines of the adjacent two speakers, wherein at the position an average attenuation in sound pressure versus the increasing sound frequencies from about 500 Hz and greater is maximum without the correction filter.

9. The loudspeaker system of claim 8, wherein the sound pressure is increased according to the position having the maximum sound pressure attenuation characteristic in a relationship between the increasing sound frequency of about 500 Hz and about 20 kHz, without the correction filter.

10. The loudspeaker system of claim 9, wherein characteristics of the speakers are set to maintain the flatness of the sound pressures at a position outside each speaker along an axial line of each speaker without the correction filter.

11. A loudspeaker system, comprising:

a loudspeaker body having a regular dodecahedron shape;

twelve full range speakers, all having same frequency characteristics, disposed on outer peripheral surfaces of the loudspeaker body in a manner that axial lines of any adjacent two speakers intersect each other at a predetermined same angle, the twelve speakers being arranged either in a manner that said twelve speakers including three sets of speaker groups connected in parallel to each other, each speaker group including four speakers connected in series, or in a manner that said twelve speakers including four sets of speaker groups connected in series, each speaker group including three speakers connected in parallel to each other; and one correction filter connected to the speakers and setting a correction value according to an attenuation factor based upon the predetermined angle to flatten sound pressures in relation to increasing sound frequencies at a position existing on a line extending straight from a center of the dodecahedron toward an outside of the dodecahedron via an apex position of the adjacent two speakers, wherein at the position an average attenuation in sound pressure versus the increasing sound frequencies from about 500 Hz and greater is maximum without the correction filter.

* * * * *